United States Patent [19]

Pendharkar et al.

[11] Patent Number: 6,024,885
[45] Date of Patent: Feb. 15, 2000

[54] PROCESS FOR PATTERNING MAGNETIC FILMS

[75] Inventors: Sandeep Pendharkar, Gilbert; Douglas J. Resnick, Phoenix, both of Ariz.

[73] Assignee: Motorola, Inc., Schaumburg, Ill.

[21] Appl. No.: 08/986,764

[22] Filed: Dec. 8, 1997

[51] Int. Cl.[7] .................................................. C23F 1/12
[52] U.S. Cl. ............................... 216/22; 216/37; 216/31; 216/72; 216/74; 216/75
[58] Field of Search .................... 216/22, 37, 51, 216/72, 74, 75

[56] References Cited

U.S. PATENT DOCUMENTS

| | | | |
|---|---|---|---|
| 4,470,873 | 9/1984 | Nakamura | 216/72 |
| 5,221,424 | 6/1993 | Rhoades | 216/75 |
| 5,607,599 | 3/1997 | Ichihara et al. | 216/75 |

OTHER PUBLICATIONS

Jung et al, "Electron Cyclotron Resonance Plasma Etching of Materials for Magneto–Resistive Random Acess memory Applications", Jour. Electr. Matl., vol. 26, No, 11. Nov. 1997.

*Primary Examiner*—C. Melissa Koslow
*Attorney, Agent, or Firm*—Eugene A. Parsons; William E. Koch

[57] ABSTRACT

A process of patterning magnetic multilayer films including the steps of successively depositing a plurality of magnetic multilayer films on a supporting substrate, selectively removing portions of the plurality of magnetic multilayer films using a reactive plasma etch including chlorine gas, and passivating in situ, or an adjacent evacuated chamber, remaining portions of the plurality of magnetic multilayer films, i.e. the memory elements, in a post-etch fluorinated plasma.

30 Claims, 1 Drawing Sheet

PROCESS FOR PATTERNING MAGNETIC FILMS

FIELD OF THE INVENTION

The present invention pertains to methods of patterning corrodible films and more particularly to methods of patterning multilayer stacks of magnetoresistive films.

BACKGROUND OF THE INVENTION

At present, magnetic multilayer films are being proposed as a storage element in memories, such as magnetic random access memories (MRAM) and the like. The memory element for the MRAM technology is a patterned structure (memory bit) of multilayer material. The magnetic multilayer material is usually composed of a stack of different materials, such as permalloy (NiFe), cobalt (Co), copper (Cu), tantalum (Ta), etc. and may include some insulator like materials, such as $Al_2O_3$, etc. A typical stack may contain as many as ten different overlying layers of these materials. To fabricate a storage element, it is necessary to deposit the materials in overlying blanket films, layer by layer, and then pattern the films into appropriate structures.

At present, the patterning is accomplished by a process called ion milling, which involves physical sputtering of the layers by an argon ion beam. However, ion milling has a serious drawback called sidewall redeposition. This means that a fraction of the removed material actually redeposits on the sidewalls of the remaining magnetic multilayer stacks. This inherent redeposition on the sidewalls gives rise to "ear-like" structures which extend upwardly from the sidewalls above the upper surface of each of the multilayer magnetic stacks. These "ear-like" structures cause, among other things, electrical shorts and bit irreproducibility. In addition to this problem, ion milling is generally not considered to be a manufacturable process.

Thus, it would be highly desirable to have a process that overcomes these problems.

It is a purpose of the present invention to provide a new and improved process of patterning magnetic multilayer films.

It is another purpose of the present invention to provide a new and improved process of patterning magnetic multilayer films which results in clean structures free of sidewall redepositions.

It is still another purpose of the present invention to provide a new and improved process of patterning magnetic multilayer films which is manufacturable.

SUMMARY OF THE INVENTION

The above problems and others are at least partially solved and the above purposes and others are realized in a process of patterning magnetic multilayer films including the steps of providing a plurality of magnetic multilayer films on a supporting substrate, selectively removing portions of the plurality of magnetic multilayer films using a reactive plasma etch, and exposing the remaining portions of the plurality of magnetic multilayer films, i.e. the magnetic multilayer stacks forming each memory cell, to a post-etch passivation plasma. The exposing step can be performed in situ or in a second evacuated chamber to which the plurality of magnetic films is moved.

In a preferred embodiment, the reactive plasma etch used to selectively remove portions of the plurality of magnetic multilayer films includes chlorine gas, such as a $Cl_2/Ar$ plasma, and the passivation plasma includes a fluorinated plasma, such as one of $CF_4$, $C_2F_6$, or $SF_6$. Since the reactive etching is not a purely physical process it does not suffer from sidewall redeposition and is a manufacturable process. The post-etch passivation prevents corrosion of the final product by removing all residual chlorine and chlorinated etch products.

BRIEF DESCRIPTION OF THE DRAWINGS

Referring to the drawings.

DESCRIPTION OF THE PREFERRED EMBODIMENTS

Figure 1:
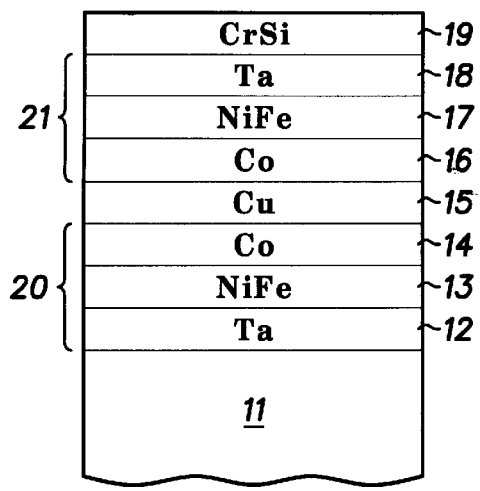
FIG. 1 is an enlarged view in cross-section of a plurality of magnetic multilayer films on a supporting substrate, portions thereof broken away.

Turning to the drawings, FIG. 1 is an enlarged view in cross-section of a plurality 10 of magnetic multilayer films on a supporting substrate 11, portions thereof broken away. Generally, plurality 10 of magnetic multilayer films are positioned on an upper surface of supporting substrate 11 by successively depositing the films one film at a time. In the specific example illustrated, a tantalum (Ta) film 12 is deposited in a blanket layer followed successively by depositions of a NiFe film 13, a cobalt (Co) film 14, a copper (Cu) film 15, a cobalt (Co) film 16, a NiFe film 17, a tantalum (Ta) film 18 and a CrSi film 19. When the blanket layers are patterned into a plurality of magnetic multilayer stacks or separate memory cells, layers 12, 13, and 14 form a first magnetic member or element 20 and layers 16, 17, and 18 form a second magnetic member or element 21 separated by nonmagnetic, electrically conducting layer 15.

As is understood by those skilled in the magnetic multilayer art, each element 20 and 21 is physically limited in some fashion (e.g. width of the cell) so that magnetic vectors are limited to be parallel to the films and pointing either to the right or to the left in FIG. 1. Further, to sense information stored in the memory cell a sense current is passed laterally through the memory cell from right to left, or vice versa. If the magnetic vectors in both elements 20 and 21 are pointing in the same direction the electrical resistance of the cell is minimum and if the magnetic vectors are pointing in opposite directions the electrical resistance of the cell is maximum. The difference between the minimum and the maximum resistance of a cell is referred to as the magnetoresistance (MR) ratio and is a measure of the sensitivity of the cell. Using external magnetic fields the magnetic vectors can be moved to whatever orientation is desired and when the field is removed the magnetic vectors remain in the desired orientation. Thus, magnetic vectors pointing in the same direction might represent a stored "1" and magnetic vectors pointing in opposite directions might represent a stored "0". By sensing the directions of the magnetic vectors, the stored information is read.

Figure 2:
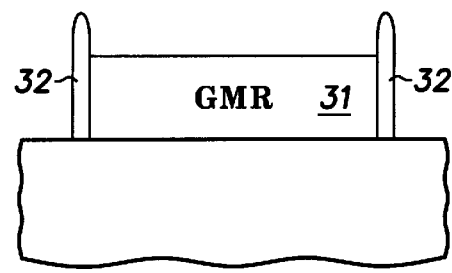
FIG. 2 is a simplified cross-sectional view of a magnetic multilayer stack formed in accordance with prior art methods.

At present, the patterning of a plurality of magnetic multilayer films, such as plurality 10 in FIG. 1, is accomplished by a process called ion milling, which involves physical sputtering of the layers by an argon ion beam. This patterning is illustrated in FIG. 2 by a single memory cell 30. In cell 30 the magnetic multilayer stack 31 is represented, for simplicity, as a single magnetic multilayer layer. Because this is a purely physical removal of the material (i.e. the material is removed by bombardment of the ion beam), a fraction of the removed material actually redeposits on the sidewalls of the remaining magnetic multilayer stacks 31. This inherent redeposition on the sidewalls gives rise to "ear-like" structures 32 which extend upwardly from the sidewalls of magnetic multilayer stack 31 above the upper surface of magnetic layer stack 31. "Ear-like" structures 32 cause, among other things, electrical shorts, poor electrical connections, poor magnetic multilayer ratios, non repeatable switching, etc. It can be seen, for example, that it is very difficult to make a satisfactory electrical connection to the sides of magnetic multilayer stack 31 because of the different materials redeposited on the sidewalls, which adversely affects the MR ratio. In addition to this problem, ion milling is generally not considered to be a manufacturable process since it is very slow and imprecise.

In a preferred embodiment of the present invention, portions of the plurality of multilayer magnetic films, e.g. plurality 10 of FIG. 1, are selectively removed by using a reactive plasma etch. The reactive plasma etch is performed in electron cyclotron resonance (ECR) or other high density plasma systems, such as an inductively coupled plasma system, or a helicon plasma system using chlorine as the source gas. Alternatively, a mixture of chlorine with another gas such as argon, nitrogen, helium, etc. can also be used.

Figure 3:
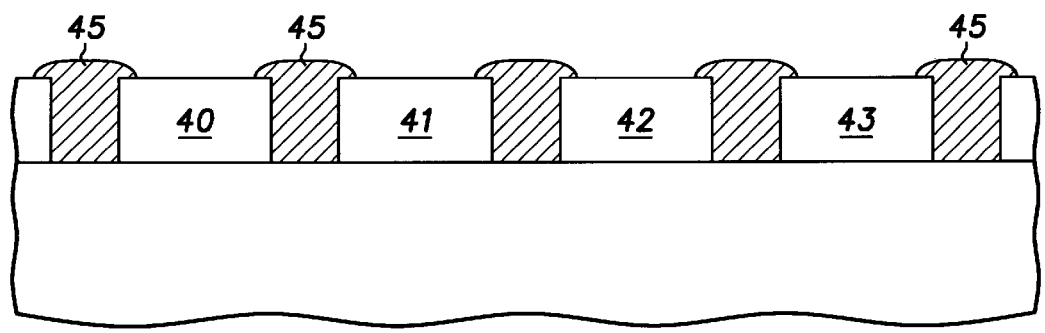
FIG. 3 is an enlarged, simplified cross-sectional view of an array of magnetic multilayer stacks, or memory elements, formed in accordance with the present invention.

In the preferred embodiment, $Cl_2/Ar$ plasma is used to reactively etch plurality 10 of magnetic multilayer films. More specifically, a patterned wafer having a plurality of blanket layers of magnetic multilayer material successively deposited thereon and a mask (not shown) formed of material such as $Si_3N_4$, $SiO_2$, or SiON, has been reactively etched using the following conditions. In a Plasma-Therm 770 ECR system, the patterned wafer is reactively etched using 10 sccm $Cl_2$, 5 sccm Ar, 2 mTorr pressure, 900 w microwave power and 40–120 W RF substrate power. Substrate temperature is controlled via a heat exchanger which was set to 30° C.–55° C. The wafer was etched to form an array of magnetic cells, with cells extending in rows and columns, as illustrated in FIG. 3 by cells 40, 41, 42, 43. Because reactive etching is not a purely physical process, no redeposition occurred on the memory cells.

After completion of the reactive etch of the magnetic multilayer films, the remaining portions of the plurality of magnetic multilayer films, i.e. cells 40, 41, 42, 43, are exposed to a post-etch passivation plasma. The exposing step can be performed in situ or in a second evacuated chamber to which the plurality of magnetic films is moved. Because at least some of the magnetic multilayer films may be corroded by the chlorine, the passivation is preferably performed as soon after the etching process is completed as is possible or practical. The passivation plasma is generally a fluorinated plasma and may include one of $CF_4$, $C_2F_6$, or $SF_6$. In a preferred embodiment, the etched wafer was retained in the etching chamber and exposed in situ to a $CF_4$ plasma, which consisted of 20 sccm $CF_4$, 5 mTorr pressure, at 900 W microwave power (no RF substrate bias), for three minutes. Basically, the passivation plasma performs a F to Cl exchange and thus prevents corrosion.

Upon completion of the passivation step the wafer was removed from the ECR system and electrical tests were performed on the magnetic cells. Electrical tests performed on Van-der-Pauw structures show a MR ratio of approximately 5.5%, which is comparable to baseline material. Also, there was no sign of corrosion anywhere on the wafer. Further, the wafer was examined by AFM and it was confirmed that no "ear-like" features were present on the wafer. With no redeposition of material on cells 40, 41, 42, and 43, metal 45 is easily deposited between cells 40, 41, 42, and 43 (see FIG. 3) to interconnect the cells into a sense line for reading information.

Figure 4:
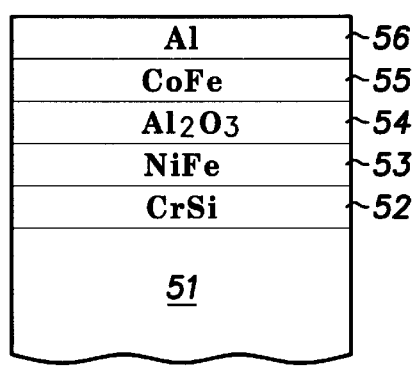
FIG. 4 is an enlarged view in cross-section of another plurality of magnetic multilayer films on a supporting substrate, portions thereof broken away.

Turning now to FIG. 4, an enlarged view in cross-section is illustrated of a plurality 50 of magnetic multilayer films on a supporting substrate 51, portions thereof broken away. Generally, plurality 50 of magnetic multilayer films are positioned on an upper surface of supporting substrate 51 by successively depositing the films one film at a time as previously described with relation to FIG. 1. In the specific example illustrated, a CrSi film 52 is deposited in a blanket layer followed successively by depositions of a NiFe film 53, an aluminum oxide ($Al_2O_3$) film 54, a CoFe film 55, and an aluminum (Al) film 56. When the blanket layers are patterned into a plurality of magnetic multilayer stacks or separate memory cells, layer 53 forms a first magnetic member or element and layer 55 forms a second magnetic member or element separated by nonmagnetic, dielectric layer 54. These specific magnetic multilayer stacks result in a tunneling junction type of memory cell in which sense current travels vertically through the cell from layer 52 to layer 56 or vice versa. Here it can be seen that redeposition as illustrated in FIG. 2 could produce shorts between layers 52 and 56 which would render the cell inoperative.

In this specific example, to selectively remove portions of the plurality 50 of magnetic multilayer films a reactive plasma etch, e.g. one of $Cl_2/Ar$, $Cl_2$, or $Cl_2/N_2$, can be used to pattern the entire structure, with either a SiN, SiON, or SiO mask, deposited using standard PECVD techniques. Alternatively, a Cr or other metal hardmask can be used generally as follows. A layer of Cr is deposited on the upper surface of plurality 50 of multilayer magnetic films. A layer of resist is deposited on the layer of Cr and patterned to form a resist mask. The layer of Cr is etched or patterned using the resist mask and a reactive plasma etch to form the Cr hardmask. In this specific example, a $Cl_2/O_2$ plasma is used to etch the Cr layer and a $Cl_2/Ar$ plasma is used to selectively remove portions of plurality 50 of magnetic multilayer films using the Cr hardmask.

Figure 5:
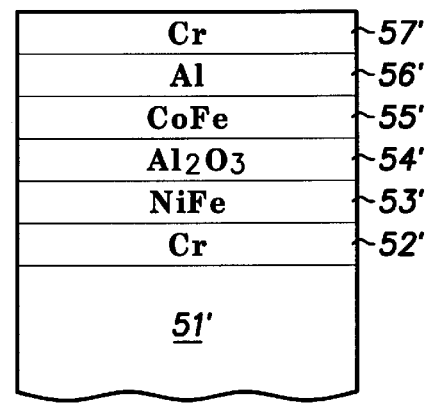
FIG. 5 is an enlarged view in cross-section of another plurality of magnetic multilayer films on a supporting substrate in accordance with an embodiment of the present invention, portions thereof broken away.

Referring specifically to FIG. 5, an enlarged view in cross-section is illustrated of a plurality 50' of magnetic multilayer films on a supporting substrate 51', portions thereof broken away. The structure illustrated in FIG. 5 is basically similar to the structure of FIG. 4 and similar parts are designated with similar numbers having a prime added to indicate the different embodiment. In this structure the CrSi layer (52 in FIG. 4) has been replaced with a Cr layer 52' which serves as an etch stop when a Cr hardmask 57' is being used for the step of selectively removing portions of plurality 50' of magnetic multilayer films. The use of etch stop layer 52' simplifies the process flow.

A new and improved process of patterning magnetic multilayer films is been disclosed which results in clean structures free of sidewall redepositions. Further, the new and improved process of patterning magnetic multilayer films is highly manufacturable. The new and improved process is equally applicable to the fabrication of in-plane and tunnel junction magnetoresistive cells and to the fabrication of in-plane and tunnel junction magnetoresistive cells in magnetoresistive random access memories.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A process of patterning magnetic multilayer films comprising the steps of:
    providing a plurality of magnetic films on a supporting substrate;
    selectively removing portions of the plurality of magnetic films using a high density reactive plasma etch; and
    exposing remaining portions of the plurality of magnetic films to a post-etch passivation plasma.

2. A process of patterning magnetic multilayer films as claimed in claim 1 wherein the step of providing the plurality of magnetic films includes providing overlying films selected from at least one of permalloy, cobalt, tantalum, and one of an electrically conductive metal and a metal oxide.

3. A process of patterning magnetic multilayer films as claimed in claim 1 wherein the step of using the high density plasma etch system includes using one of an electron cyclotron resonance system, an inductively coupled plasma system, and a helicon plasma system.

4. A process of patterning magnetic multilayer films as claimed in claim 1 wherein the step of selectively removing portions of the plurality of magnetic films using the reactive plasma etch includes using chlorine.

5. A process of patterning magnetic multilayer films as claimed in claim 4 wherein the chlorine is present in combination with a second gas.

6. A process of patterning magnetic multilayer films as claimed in claim 5 wherein the wherein the second gas is selected from argon, nitrogen, and helium.

7. A process of patterning magnetic multilayer films as claimed in claim 1 wherein the step of exposing remaining portions of the plurality of magnetic films to the post-etch passivation plasma includes using a fluorinated plasma.

8. A process of patterning magnetic multilayer films as claimed in claim 5 wherein the step of using the fluorinated plasma is selected from one of $CF_4$, $C_2F_6$, and $SF_6$.

9. A process of patterning magnetic multilayer films as claimed in claim 1 wherein the step of selectively removing portions of the plurality of magnetic films includes the step of providing a mask on an upper surface of the plurality of magnetic films prior to using the reactive plasma etch.

10. A process of patterning magnetic multilayer films as claimed in claim 7 wherein the mask is selected from at least one of a $Si_3N_4$, $SiO_2$, or SiON hardmask.

11. A process of patterning magnetic multilayer films as claimed in claim 10 wherein the step of using one of the $Si_3N_4$, $SiO_2$, or SiON hardmask includes depositing the hardmask using plasma enhanced chemical vapor deposition.

12. A process of patterning magnetic multilayer films as claimed in claim 7 wherein the mask comprises a Cr hardmask.

13. A process of patterning magnetic multilayer films as claimed in claim 12 wherein the step of using a Cr hardmask includes the steps of forming a layer of Cr on the upper surface of the plurality of magnetic films, depositing a layer of resist on the layer of Cr, patterning the layer of resist to form a resist mask, and etching the layer of Cr using the resist mask.

14. A process of patterning magnetic multilayer films as claimed in claim 13 wherein the step of etching the layer of Cr using the resist mask and the reactive plasma etch includes using a $Cl_2/O_2$ plasma and the step of selectively removing portions of the plurality of magnetic films using a reactive plasma etch includes using a $Cl_2/Ar$ plasma.

15. A process of patterning magnetic multilayer films as claimed in claim 14 including in addition a step of providing a Cr layer between the plurality of magnetic films and the supporting substrate.

16. A process of patterning magnetic multilayer films as claimed in claim 1 wherein the step of exposing remaining portions of the plurality of magnetic films to the post-etch passivation plasma is performed in situ.

17. A process of patterning magnetic multilayer films as claimed in claim 1 wherein the step of exposing remaining portions of the plurality of magnetic films to the post-etch passivation plasma is performed in a second evacuated chamber.

18. A process of patterning magnetic multilayer films comprising the steps of:
    successively depositing a plurality of magnetic films on a supporting substrate;
    selectively removing portions of the plurality of magnetic films using a high density reactive plasma etch including chlorine gas; and
    passivating remaining portions of the plurality of magnetic films in a post-etch fluorinated plasma.

19. A process of patterning magnetic multilayer films as claimed in claim 18 wherein the chlorine is present in combination with a second gas.

20. A process of patterning magnetic multilayer films as claimed in claim 19 wherein the second gas is selected from argon, nitrogen, and helium.

21. A process of patterning magnetic multilayer films as claimed in claim 18 wherein the step of exposing remaining portions of the plurality of magnetic films to the post-etch passivation plasma is performed in situ.

22. A process of patterning magnetic multilayer films as claimed in claim 18 wherein the step of exposing remaining portions of the plurality of magnetic films to the post-etch passivation plasma is performed in a second evacuated chamber.

23. A process of patterning magnetic multilayer films comprising the steps of:
    providing a supporting substrate having a surface;
    depositing a layer containing Cr on the surface of the supporting substrate;
    successively depositing a plurality of magnetic films on the layer containing Cr;
    providing a mask on an upper surface of the plurality of magnetic films;
    selectively removing portions of the plurality of magnetic films using the mask and a high density reactive plasma etch including chlorine gas; and
    passivating remaining portions of the plurality of magnetic films in a post-etch fluorinated plasma.

24. A process of patterning magnetic multilayer films as claimed in claim 23 wherein the mask is selected from at least one of a $Si_3N_4$, $SiO_2$, or SiON hardmask.

25. A process of patterning magnetic multilayer films as claimed in claim 24 wherein the step of using one of the $Si_3N_4$, $SiO_2$, or SiON hardmask includes depositing the hardmask using plasma enhanced chemical vapor deposition.

26. A process of patterning magnetic multilayer films as claimed in claim 25 wherein the mask comprises a Cr hardmask.

27. A process of patterning magnetic multilayer films as claimed in claim 26 wherein the step of using a Cr hardmask includes the steps of forming a layer of Cr on the upper surface of the plurality of magnetic films, depositing a layer of resist on the layer of Cr, patterning the layer of resist to form a resist mask, and etching the layer of Cr using the resist mask.

28. A process of patterning magnetic multilayer films as claimed in claim 27 wherein the step of etching the layer of Cr using the resist mask and the reactive plasma etch includes using a $Cl_2/O_2$ plasma and the step of selectively removing portions of the plurality of magnetic films using a high density reactive plasma etch includes using a $Cl_2/Ar$ plasma.

29. A process of patterning magnetic multilayer films as claimed in claim 23 wherein the step of exposing remaining portions of the plurality of magnetic films to the post-etch passivation plasma is performed in situ.

30. A process of patterning magnetic multilayer films as claimed in claim 23 wherein the step of exposing remaining portions of the plurality of magnetic films to the post-etch passivation plasma is performed in a second evacuated chamber.

* * * * *

UNITED STATES PATENT AND TRADEMARK OFFICE
CERTIFICATE OF CORRECTION

PATENT NO.    : 6,024,885
DATED         : February 15, 2000
INVENTOR(S)   : Pandharkar et al.

It is certified that error appears in the above-identified patent and that said Letters Patent is hereby corrected as shown below:

<u>Column 1,</u>
Line 3, after the Title, please add as a new first paragraph the following paragraph:
   -- This invention was made with Government support under Agreement No. MDA972-96-3-0016 awarded by DARPA. The Government has certain rights in the invention. --

Signed and Sealed this

Nineteenth Day of August, 2003

JAMES E. ROGAN
*Director of the United States Patent and Trademark Office*